United States Patent [19]

Onodera et al.

[11] Patent Number: 5,109,197

[45] Date of Patent: Apr. 28, 1992

[54] NUCLEAR MAGNETIC RESONANCE MULTI-ECHO IMAGING METHOD AND APPARATUS

[75] Inventors: Takashi Onodera, Fukushima; Hidemi Shiono, Akigawa; Hideki Kohno, Tama, all of Japan

[73] Assignee: Hitachi, Ltd., Tokyo, Japan

[21] Appl. No.: 578,766

[22] Filed: Sep. 7, 1990

[30] Foreign Application Priority Data

Sep. 18, 1989 [JP] Japan ................................ 1-239977

[51] Int. Cl.⁵ .............................................. G01R 33/20
[52] U.S. Cl. .................................... 324/309; 324/307
[58] Field of Search ............... 324/306, 307, 309, 310, 324/311, 312, 313, 314, 318, 322; 128/653 R, 653 A, 653 SC

[56] References Cited

U.S. PATENT DOCUMENTS

| | | | |
|---|---|---|---|
| 4,862,081 | 8/1989 | Denison | 324/307 |
| 4,876,509 | 10/1989 | Perlmutter | 324/309 |
| 4,937,526 | 6/1990 | Ehman et al. | 324/309 |
| 4,987,371 | 1/1991 | Glover et al. | 324/320 |
| 4,998,065 | 3/1991 | Koizumi | 324/309 |
| 5,025,216 | 6/1991 | Pauly et al. | 324/309 |

Primary Examiner—Michael J. Tokar
Attorney, Agent, or Firm—Antonelli, Terry, Stout & Kraus

[57] ABSTRACT

A nuclear magnetic resonance multi-echo imaging method and an apparatus therefor in which gradient field pulses having predetermined products of intensity and time are applied on both sides of an inversion pulse in at least two of three directions which are orthogonal to each other to dephase components of a magnetization vector which leads to an artifact signal and an error signal, whereby only a normal echo signal can be sampled to form a correct image.

11 Claims, 5 Drawing Sheets

F I G. 8
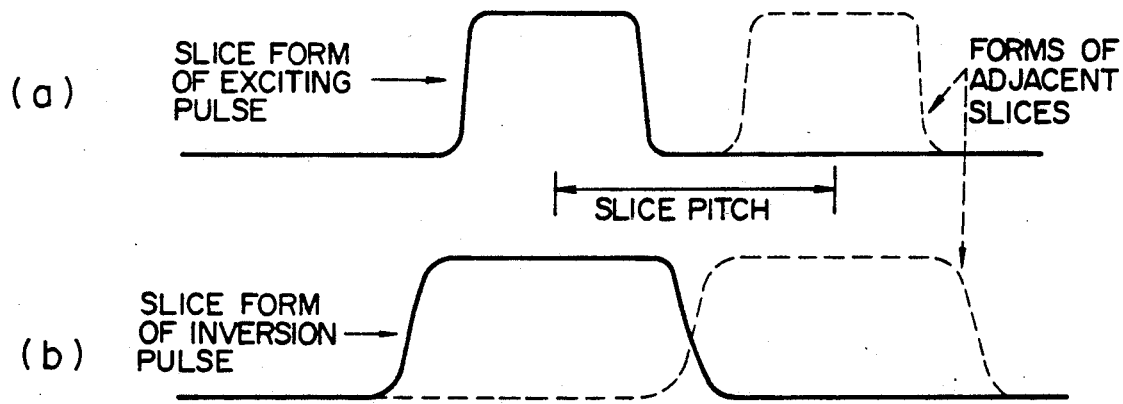

NUCLEAR MAGNETIC RESONANCE MULTI-ECHO IMAGING METHOD AND APPARATUS

BACKGROUND OF THE INVENTION

The present invention relates to multi-echo imaging method and apparatus utilizing nuclear magnetic resonance (hereinafter simply referred to as "NHR") and more particularly to imaging method and apparatus capable of making correcter an image obtained in respect of spin-spin relaxation time T2.

Conventionally, the multi-echo imaging method is described in, for example, "Magnetic Resonance in Medicine, 3, pp 397–417 (1986)".

When a 180° RF pulse is applied to a magnetization vector $\overline{M}$ thrown down by a 90° RF pulse to a predetermined plane, the resulting vector has, in addition to a component $\overline{M}-$ which is 180° rotated as depigned, a component $\overline{M}+$ not rotated and a component $\overline{Mo}$ rotated by half the angle (=90°). The components $\overline{M}+$ and $\overline{Mo}$ develop because the 180° RF pulse is not generated correctly and the magnetization vector $\overline{M}$ is not rotated through exact 180° (see U.S. Pat. No. 4,484,138). Of the unwanted components, $\overline{Mo}$ is directed in the same direction as that of the static magnetic field and is therefore not detected as an echo signal representative of T2. On the other hand, the component $\overline{M}+$ forms an artifact.

As is known in the art, the component $\overline{M}+$ leading to the artifact can be dephased effectively by applying pulses of additional magnetic field gradient before and after the 180° RF pulse. In the aforementioned U.S. Pat. No. 4,484,138, the additional pulse is called a crusher pulse.

Exactly, the artifact can be cancelled out by the additional pulses. However, an image is formed by putting together a plurality of echoes, that is, by applying the 180° RF pulse a plurality of times, the resulting image becomes incorrect. This is because the echo signals sampled for formation of the image contain error signals.

For example, when considering an instance where the 180° RF pulse is applied three times, a preferable component is rotated through 180°×3=540° (=180°). Contrary to this, many components causing error signals (error components) such as of 0°+180°+0° and 90°+0°+90° exist.

The greater the number of applications of the 180° RF pulse, the greater the number of error components becomes.

SUMMARY OF THE INVENTION

The image becomes incorrect because of the aforementioned error signal. Therefore, an object of the present invention is to eliminate an artificial signal and an error signal from an echo signal to be sampled by dephasing a component causing an artifact (artifact component) as well as the error component, thereby making correct an image obtained when multi-echo imaging.

According to the invention, to accomplish the above object, not only gradient field pulses are added, on both sides of the inversion pulse, to the gradient field pulse in the slice selection direction for dephasing the artifact component and error component but also gradient field pulses are added, before and after the inversion pulse, in a direction of the readout gradient field (hereinafter referred to as readout direction) which is orthogonal to the slice selection direction and/or in a direction of the phase encoding gradient field (hereinafter referred to as encoding direction) which is also orthogonal to the slice selection direction. Namely, by utilizing these additional pulses in the orthogonal field directions, the artifact component and error component can be dephased. With this construction, combinations of magnitudes and widths of the gradient field pulses associated with the respective inversion pulses are selected in such a manner that dephasing of the artifact component and the error component can be maximized for elimination of these components.

In addition, when the multi-slice method in which measurement wait time is utilized to image another slice plane is used in combination, it is necessary to use a band-limited RF pulse (selective pulse) as the inversion pulse. In this case, in order to decrease an error signal depending on the slice form of the selective pulse, the slice pitch is made to be greater than the thickness of the slice plane, wherein the slice thickness of the inversion pulse is set to be larger than the slice thickness of the exciting pulse and besides equal to or smaller than the slice pitch. In this manner, the waveform of the inversion pulse can be optimized for suppressing the error component to a minimum.

Further, the magnitudes and widths of the gradient field pulses in the three directions of slice direction, readout direction and encoding direction may be multiplied with a suitable matrix of rotation to obtain magnitudes and widths of a new gradient field by which an image corresponding to a slice plane inclined in a desired direction can be obtained.

The principle of the invention will now be described with reference to FIGS. 1 and 2.

For presupposition, the following should first be confirmed. More specifically, the phase of a nuclear spin caused by an exciting pulse (90° RF pulse) Pe is inverted by inversion pulses (180° RF pulses) P1, P2, .. . Pn... However, because of imperfectness of the inversion pulse, a component $\overline{M}+$ not rotated and a component $\overline{Mo}$ in the longitudinal magnetization direction are caused concomitantly. When the application of the inversion pulse is repeated a plurality of times, the individual components $\overline{M}-$, $\overline{M}+$ and $\overline{Mo}$ are superposed on each other, causing an artifact signal and an error signal. The component $\overline{M}-$ rotated at that time considers a gradient field subsequently applied as a negative quantity and is susceptive thereto. The component $\overline{M}+$ not rotated considers the gradient field as a positive quantity and is susceptive thereto but the component $\overline{Mo}$ in the longitudinal magnetization direction is insusceptive to the gradient field.

Reference should now be made to an n-th echo signal shown in FIG. 2. As described above, this echo signal contains a normal signal, an artifact signal and an error signal. Considering a magnetization vector component $\overline{Mn}$ responsible for causing the n-th echo signal, this component $\overline{Mn}$ has been affected by additional gradient field pulses applied in association with 1st to n-th echo signals. When additional gradient field pulses are applied in three directions which are orthogonal to each other as shown in FIG. 2, the component $\overline{Mn}$ is affected by gradient field pulses in the three directions. Accordingly, the respective gradient field pulses have the influence upon the component $\overline{Mn}$ represented by a function Fn (S, R, E). In this function, variables S, R and E designate the total application amounts of the individual gradient field pulses in the slice selection, readout and encoding directions, respectively, and are indicated as follows:

$$S = S_1 + \sum_{i=1}^{n-1} W_i(S_{i+1} + S_i) + W_n S_n$$
$$R = R_1 + \sum_{i=1}^{n-1} W_i(R_{i+1} + R_i) + W_n R_n \quad (1)$$
$$E = E_1 + \sum_{i=1}^{n-1} W_i(E_{i+1} + E_i) + W_n S_n$$

where W1, W2 ... Wn are quantities each of which can take a value of $-1$, 0 or $+1$ and are determined by the influence which the individual gradient field pulses have upon the component $\overline{M}n$ of magnetization vector at the inversion pulse Pn. Especially, the component $\overline{M}n$ affected by $Wn = (-1)^n$ provides the normal echo signal. On the other hand, the component $\overline{M}n$ affected by combinations of Wn Other than $Wn = (-1)^n$ provides the artifact and error components.

According to the invention, the variables S, R and E of the function Fn are so set that both the artifact and error components can be dephased. In other words, the magnitudes (the products of intensity and time) of the gradient field pulses applied before and after each inversion pulse are so adjusted as to dephase all the artifact and error components.

The study conducted by the present inventors showed that the gradient field pulses in at least two directions have to be adjusted in order to execute the aforementioned dephasing. And, the total application amount of each gradient field pulse must be sufficiently larger than zero in absolute value because the magnetization vector component $\overline{M}n$ can be dephased by the magnitude of the absolute value.

The gradient field pulses applied to dephase the unwanted components as described previously are illustrated by dotted line in FIGS. 1 and 2.

BRIEF DESCRIPTION OF THE DRAWINGS

FIG. 8 is a diagram showing conceptually a slice selection characteristic in the embodiments of FIGS. 5 to 7.

DESCRIPTION OF THE PREFERRED EMBODIMENTS

The invention will now be described by way of example with reference to the accompanying drawings.

Figure 4:
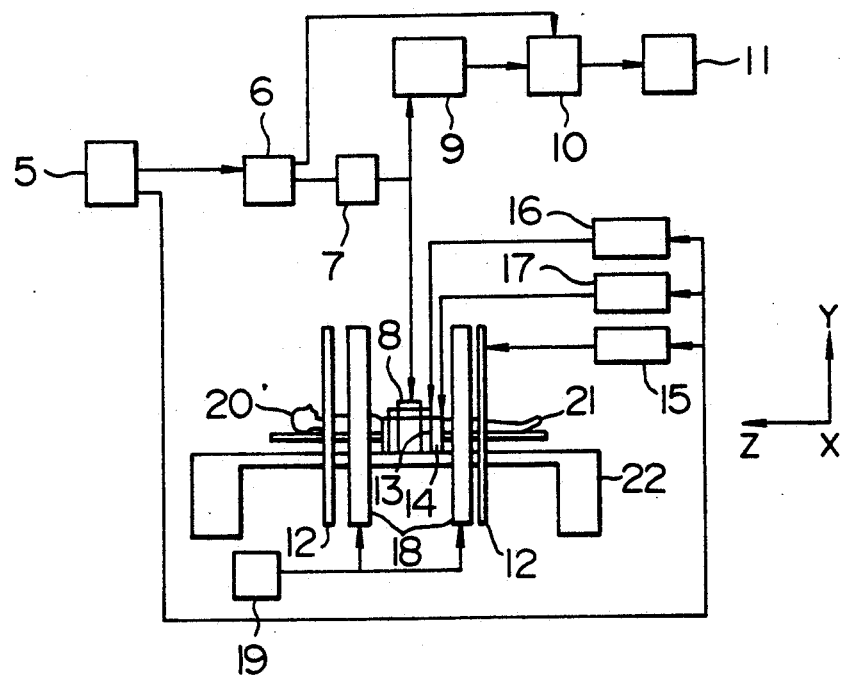
FIG. 4 is a block diagram of an imaging apparatus used in the embodiments of the invention.

FIG. 4 shows the construction of an imaging apparatus used for implementation of embodiments of the invention. A controller 5 delivers various instructions to units at predetermined timings. The output signal of an RF pulse generator 6 is amplified by an amplifier 7 and used to excite an RF coil 8. A signal component detected by the RF coil 8 is amplified by an amplifier 9, detected by a detector 10 and finally converted into an image by a signal processor 11. Gradient magnetic fields in Z, X and Y directions, orthogonal to each other, are respectively generated by gradient magnetic field coils 12, 13 and 14 which are driven by amplifiers 15, 16 and 17, respectively. A static magnetic field is generated by a coil 18 which is driven by a power supply 19. The coil 14 has the same construction as that of the coil 13 and is rotated about Z axis by 90 degrees relative to the coil 13.

A human body 20 standing for an object to be examined is placed on a bed 21 which in turn is movable on a support 22.

Figure 1:
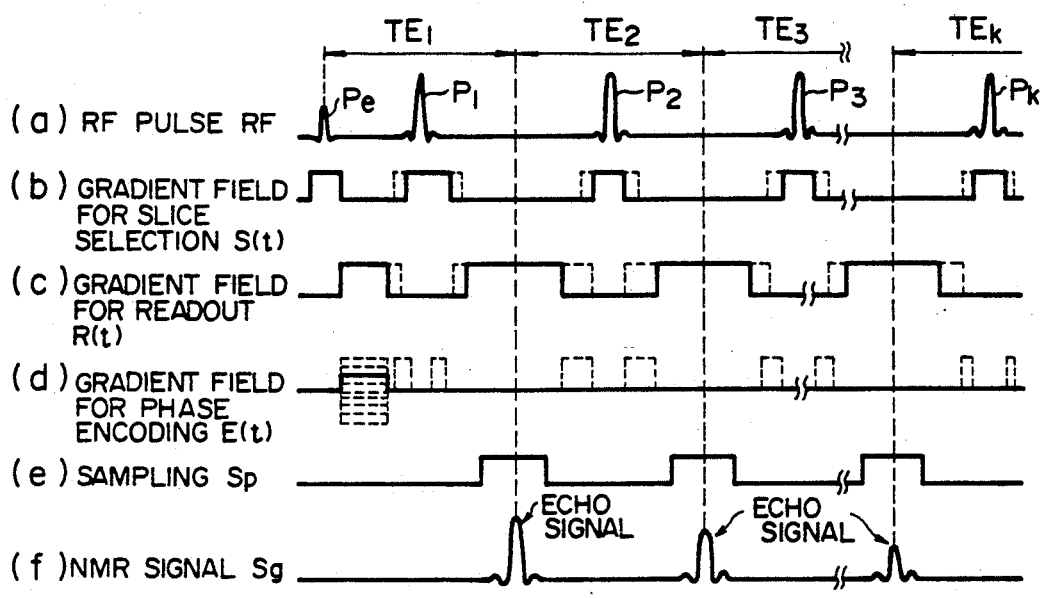
FIGS. 1 and 2 are waveform diagrams showing, in general, measurement sequence in each embodiment of the invention.
Figure 2:
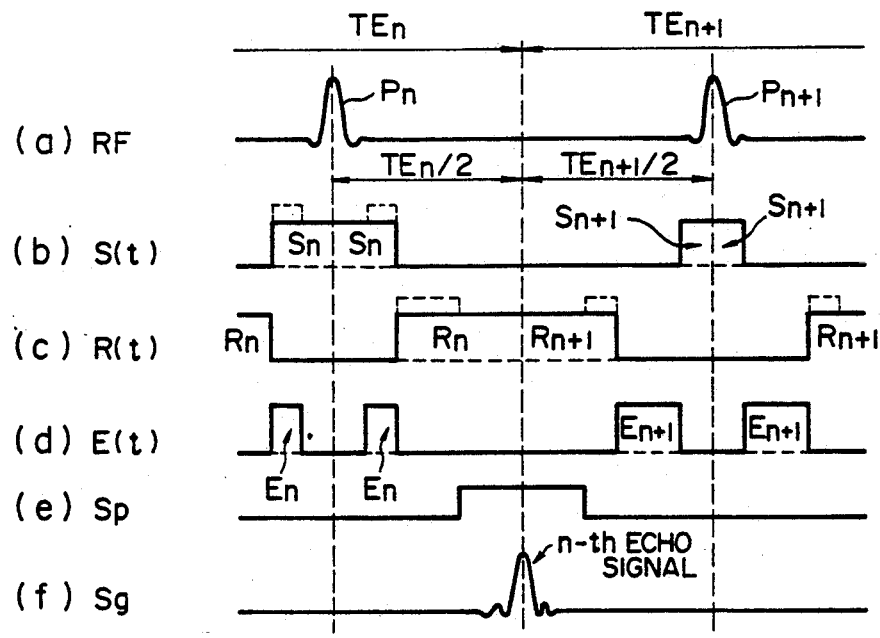
Figure 3:
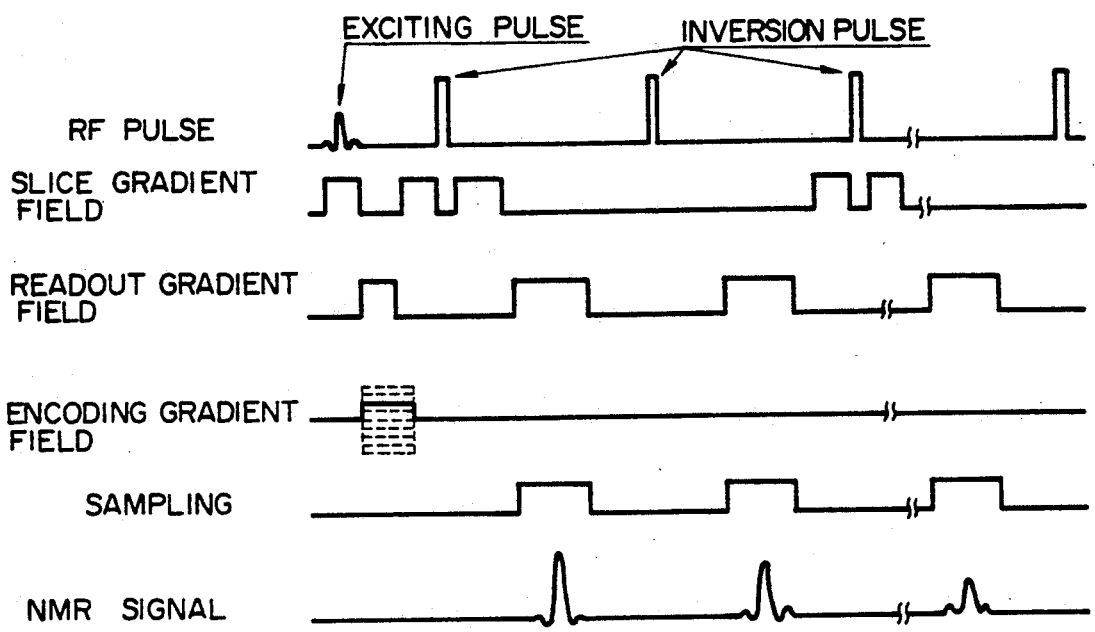
FIG. 3 is a waveform diagram showing the conventional multi-echo imaging method.

FIGS. 1 and 2 show general forms of measurement sequence according to embodiments to be described later individually. Essentially, each embodiment is based on the two-dimensional Fourier transform method (2DFT method) utilizing phase encoding. Obviously, the present invention may be applied to the three-dimensional Fourier transform method.

Referring to FIG. 1, an RF pulse RF generated from the coil 8 is illustrated at section (a), a gradient field for slice selection and following additional pulses generated from any one of the gradient field coils 12, 13 and 14, that is, a waveform S(t) of a gradient field in a direction of slice selection is illustrated at (b), a waveform R(t) of a gradient field for readout and following gradient fields in a direction of readout generated from any one of the remaining gradient field coils 12, 13 and 14 is illustrated at (c), and a waveform E(t) of a gradient field for phase encoding (a gradient field in a direction of encoding) generated from the remainder of gradient field coil is illustrated at (d). Which one of the gradient field coils 12, 13 and 14 is used to generate the respective gradient fields shown at (b), (c) and (d) in FIG. 1 is selected depending on which direction a slice is imaged in.

Firstly, when a band-limited 90° RF pulse Pe for spin excitation (excitation pulse) is applied together with a gradient field for slice selection, a nuclear spin in a slice is excited. Subsequently, a gradient field for phase encoding and a gradient field for readout which dephases the spin in advance are applied. Thereafter, a gradient field for slice selection is again applied together with a 180° pulse (inversion pulse) P1 for echo formation and then a gradient field for readout is applied, thereby ensuring that the spin is rephased and an echo signal as shown at (f) in FIG. 1 is obtained. The above sequence is for obtaining a first echo during a period TE1. A signal to the signal processor 11 of FIG. 4 is sampled within an interval of time as shown at (e) in FIG. 1 over which the intensity of the gradient field for readout remains constant. Subsequently, during a period TE2 shown in FIG. 1, an inversion pulse P2 is applied at an intermediate time point of this period so that the peak of a second echo may appear at the end of this period. Further, inversion pulses P3, ..., Pk are applied sequentially so that peaks of echoes may appear at the end of individual periods TE3, ..., TEk. In the present embodiment, a band-limited RF pulse (selective pulse) is used as the inversion pulse and applied simultaneously with the application of each gradient field for slice selection.

A series of sequence described as above is repeated at the rate of the amplitude of the prepared gradient field for phase encoding. By subjecting data obtained from the repetition of sequence to the two-dimensional Fourier transform having variables of two directions i.e., repetition direction and time lapse direction for measurement of each echo, a spin distribution can be obtained and by comparing images originating from the 1st to k-th echoes, information concerning spin-spin relaxation can be obtained.

Exaggeratedly illustrated in FIG. 2 is a portion around the n-th echo in the sequence of FIG. 1, that is, a portion covering the n-th period TEn and the (n+1)th period TEn+1. More particularly, the RF pulse is illustrated at (a) in FIG. 2, the waveform of the gradient field for slice selection is illustrated at (b), the waveform of the gradient field for readout is at (c), the waveform of gradient field for phase encoding is at (d), the signal sampling period is at (e) and the NMR signal is at (f). Within each period, the product of intensity and time (time integral of intensity) of the gradient field for slice selection remains unchanged before and after the inversion pulse and the product of intensity and time of the gradient field for readout also remains unchanged around the inversion pulse. As shown in FIG. 2, within the n-th period, the product of intensity and time of the gradient field for slice selection before and after the inversion pulse Pn is designated by Sn and that of the gradient field for readout around that inversion pulse is designated by Rn. In some embodiments, within each period, gradient field pulses in the same direction as that of the gradient field for phase encoding are applied before and after the inversion pulse. The product of intensity and time of this pulse is represented by En.

The present invention is featured in that the generation of artifact signal and error signal due to imperfection of frequency limitation of RF field pulse i.e., imperfection of slice selection can be eliminated by combining the magnitudes of Sn, Rn and En (n=1 ... k). Several specific embodiments will now be described.

Embodiment 1

In this embodiment, sampling is carried out till the fourth echo and values of the products of intensity and time Sn, Rn and En of the respective gradient field pulses explained in connection with FIG. 2 are as follows:

$$S_1, S_3 = S_o, S_2, S_4 = 2S_o \\ R_1, R_4 = R_o, R_2, R_3 = 2R_o \\ E_1, E_2, E_3, E_4 = 0$$ (2).

In this case, the degree of attenuation of the error signal due to the gradient field pulse is determined in compliance with the magnitude of dephasing due to So and Ro. When So and Ro are selected to be sufficiently large, $|S| \geq |So|$ or $|R| \geq |Ro|$ can stand in connection with S and R in equation (1) and therefore error components in each echo signal can all be eliminated.

Figure 5:
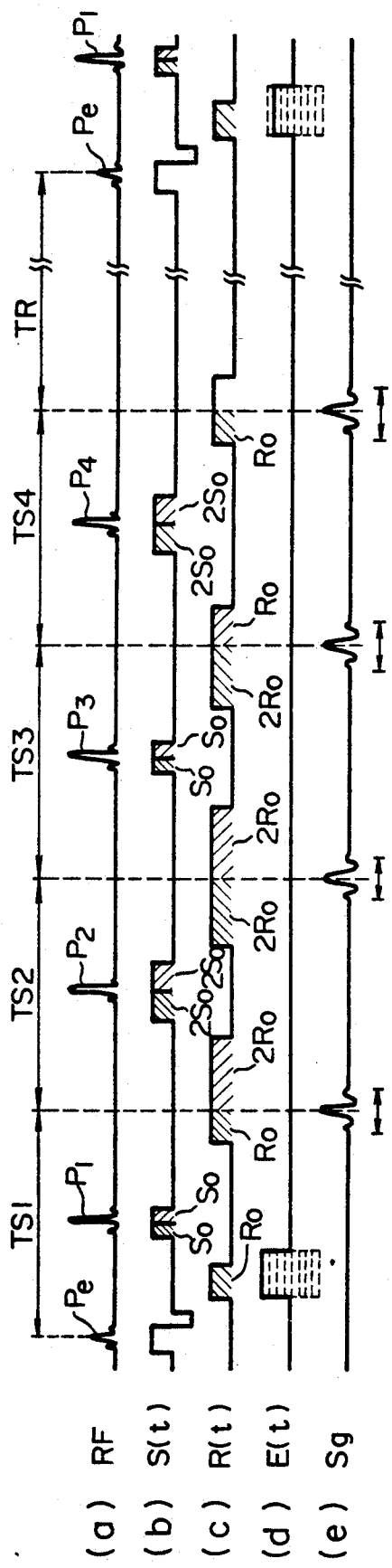
FIGS. 5, 6, 7 and 9 are waveform diagrams illustrative of specified embodiments of the invention.

The present embodiment of sequence defined by equation (2) may be illustrated exemplarily by using waveforms as shown in FIG. 5. Illustrated at (a) in FIG. 5 is the RF field pulse RF, at (b) is the waveform S(t) of the slice selection gradient field, at (c) is the waveform R(t) of the readout gradient field, at (d) is the waveform E(t) of the phase encoding gradient field and at (e) is the NMR signal. In this example, the slice selection gradient field pulse applied within each of the periods TS2 and TS4 has the duration originally required for slice selection which is added with leading and trailing extensions and similarly, the readout gradient field pulse applied within each of the periods TS2 and TS3 has the duration originally required for signal readout which is added with leading and trailing extensions. When the wait time designated by TR has elapsed following completion of four spin echo measurement operations conducted under the application of the four inversion pulses P1, P2, P3 and P4, the spin substantially recovers a state of thermal equilibrium. Then, the amplitude of the phase encoding gradient field is changed and measurement resumes.

According to the present embodiment, the error signal and the artifact signal can be dephased. Accordingly, by setting the imaging condition of the multi-echo method in compliance with the present embodiment, a correct image can be obtained.

Embodiment 2

In this embodiment, sampling is conducted till the sixth echo. The Sn, En and Rn (n=1-6) are as follows:

$$S_1, S_6 = S_o, S_2, S_5 = 3S_o, S_3, S_4 = 2S_o \\ R_1, R_3, R_5 = R_o, R_2, R_4, R_6 = 2R_o \\ E_1 \sim E_6 = 0$$ (3).

Figure 6:
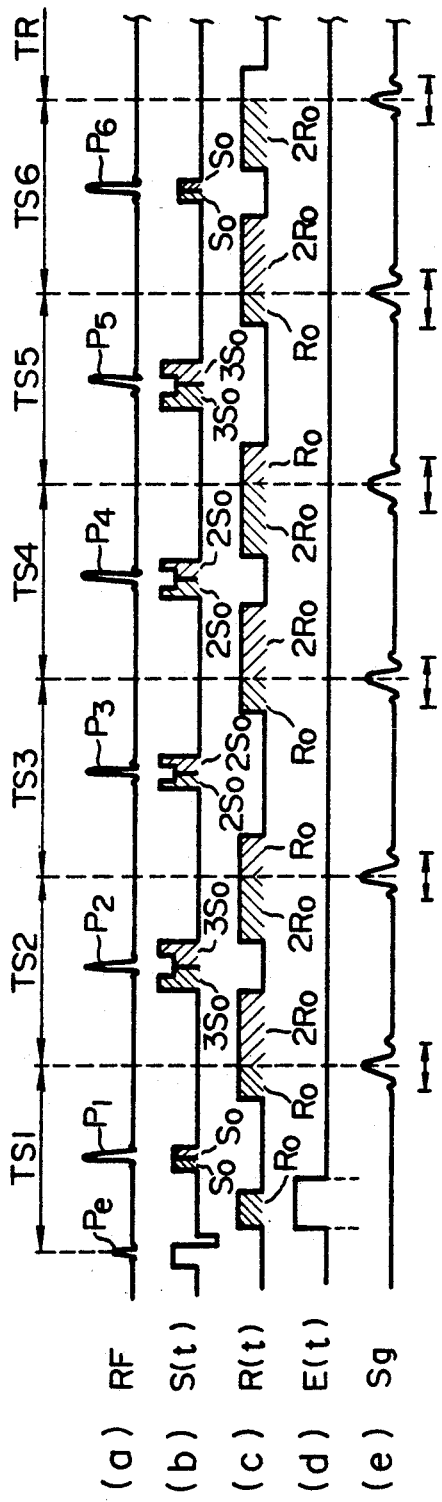

The sequence defined by equation (3) may be illustrated exemplarily by using waveforms as shown at sections (a) through (e) in FIG. 6. In this example, in order to permit the gradient magnetic pulse to have the magnitude which is sufficient to eliminate the error signal component in the NMR signal while minimizing the increase in measurement time, the waveform of the slice selection gradient field pulse is designed purposely. More specifically, the slice selection gradient field pulses within the periods TS3 and TS4 need the product of intensity and time 2So and the slice selection field gradient field pulses within the periods TS2 and TS5 need the product of intensity and time 3So, wherein not only the duration originally required for slice selection i.e., the duration in synchronism with each of the inversion pulses P2 to P5 is added with leading and trailing extensions but also the intensity is made to be higher at the added extensions than at the duration in synchronism with P2, P3, P4 or P5. Since the intensity of the slice selection gradient field pulse remains unchanged at the duration in synchronism with each inversion pulse throughout the periods TS1 to TS6, all of the inversion pulses P1 to P6 may be of the same frequency band.

Embodiment 3

In this embodiment, sampling is conducted till the eighth echo and the Sn, Rn and En (n=1-8) are valued as follows:

$$S_1, S_3, S_5, S_7 = S_o, \\ S_2, S_4, S_6, S_8 = 2S_o, \\ R_1, R_4, R_5, R_8 = R_o, \\ R_2, R_3, R_6, R_7 = 2R_o, \\ E_1, E_3, E_6, E_8 = 0, \\ E_2, E_4, E_5, E_7 = E_o$$ (4).

Figure 7:
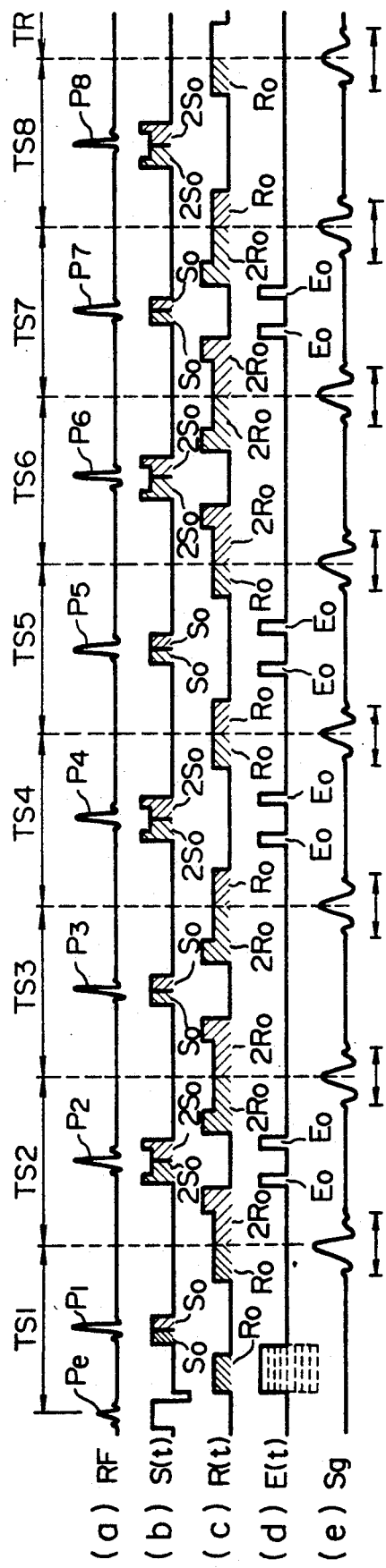

The sequence defined by equation (4) is exemplified at (a) through (e) in FIG. 7. In this example, the expedient as applied to the waveform of the slice selection gradient field pulse described in connection with FIG. 6 is also applied to the waveform of the readout gradient field pulse. In particular, within each of the periods TS2, TS3, TS6 and TS7, not only the duration originally required for readout of the readout gradient field pulse i.e., the duration in synchronism with the signal sampling period depicted under each NMR signal at (e) in FIG. 7 is added with leading and trailing extensions but also the gradient field intensity is made to be higher at the added extensions than at the sampling period. Gradient field pulses for elimination of error component are applied in the same direction as the phase encoding gradient field, as shown at (d) in FIG. 7, before and after each of the inversion pulses P2, P4, P5 and P7 so as not to overlap each inversion pulse.

Embodiment 4

In this embodiment, sampling is conducted till the fifth echo and the Sn, Rn, and En (n = 1−5) are valued as follows:

$$\left.\begin{array}{l} S_1, S_3, S_5 = 2S_o, \\ S_2, S_4 = S_o, \\ R_1, R_3, R_5 = R_o \\ R_2, R_4 = 2R_o \\ E_1, E_2 = 0 \\ E_3, E_4, E_5 = E_o \end{array}\right\} \quad (5).$$

Alternatively, even when each embodiment is so modified that the values of Sn, Rn and En in each embodiment are maintained but the number of echo sampling operations is decreased, the artifact signal and the error signal can be dephased.

For example, when the fourth embodiment is modified to $S_1, S_3 = 2S_o,$
$S_2, S_4 = S_o,$
$R_1, R_3 = R_o,$
$R_2, R_4 = 2R_o$
$E_1, E_2 = 0$
$E_3, E_4 = E_o$ or the third embodiment is modified to $S_1, S_3 = S_o,$
$S_2, S_4 = 2S_o,$
$R_1, R_4 = R_o$
$R_2, R_3 = 2R_o$
$E_1, E_3 = 0$
$E_2, E_4 = E_o$ an image obtained when sampling is conducted till the fourth echo signal can be as correct as that obtained with the first embodiment.

In the embodiments shown in FIGS. 5 to 7, the exciting pulse Pe as well as the inversion pulse is subjected to band limitation so that the band-limited inversion pulse behaves as the selective pulse. Accordingly, a spin at a position remote from a selected slice is not affected over the whole measurement time and the measuring method called multi-slice method can be applied wherein during the wait time designated by TR in FIGS. 5 to 7 which needs to intervene between cycles of sequence conducted under sequentially changed phase encoding gradient field, measurement of selective excitation and inversion of a different slice which is parallel to a first slice can be carried out. In this manner, multi-echo images of a plurality of slices which are parallel to each other can be measured without suffering from a substantial increase in the whole measurement time. However, the slice selection based on the frequency-limited RF pulse is of imperfect rectangle, raising a problem that interference occurs between the plurality of slices. Especially, in the multi-echo measurement in the present invention, the inversion pulses are sequentially applied to accumulate their imperfectness and a special countermeasure against this problem is needed.

FIG. 8 diagrammatically shows the countermeasure applicable to the multi-slice method. Referring to FIG. 8, a slice selection characteristic due to band limitation of the exciting pulse Pe of FIGS. 5 to 7 is illustrated by solid curve at (a), and a slice selection characteristic due to band limitation of the inversion pulses P1 to P4 (or P1 to P6 or P1 to P8) is illustrated by solid curve at (b). On the other hand, illustrated by dotted curve at (a) is a slice characteristic due to the exciting pulse in the multi-echo measurement at the second slice conducted during the wait time of FIGS. 5 to 7, and by dotted curve at (b) is a slice characteristic due to the inversion pulse in that multi-echo measurement. As is clear from FIG. 8, the slice thickness of the inversion pulse and the slice pitch (center to center distance) between slices are set to be larger than the thickness of the exciting pulse. Especially, by optimizing the frequency band characteristic of the inversion pulse such that the slice selection characteristic is substantially flattened within the range of the slice thickness of the exciting pulse, mixing of error signal concomitant with the slice form of the inversion pulse can be mitigated.

For details of the multi-slice, one may refer to, for example, U.S. Pat. No. 4,757,260.

Figure 9:
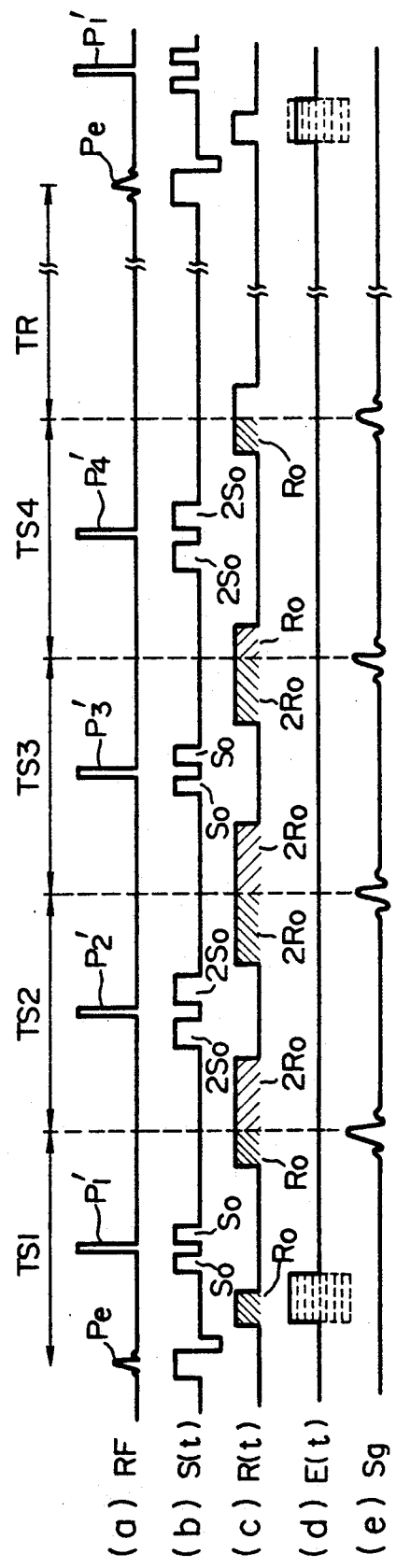

In the embodiments set forth so far, the band-limited RF pulse is used as the inversion pulse which is used with the gradient field to invert the spin in the slice. However, even when a wide band 180° RF pulse (non-selective inversion pulse) is used as the inversion pulse, the present invention may be applied to permit multi-echo measurement capable of minimizing the error component. FIG. 9 shows a further embodiment of the invention wherein the inversion pulse in the multi-echo method for conducting sampling till the fourth echo described previously in connection with FIG. 5 is replaced with a non-selective inversion pulse. In order to attenuate the error component mixing with the echo signal, the slice selection gradient field, readout gradient field and phase encoding gradient field pulses have the products of intensity and time Sn, Rn and En (n=1, 2, 3, 4), respectively, which are pursuant to equation (2) described hereinbefore. Sequence in this embodiment differs from that of FIG. 5 in that non-selective inversion pulses P1', P2', P3' and P4' containing wide band frequencies are applied in place of the inversion pulses P1, P2, P3 and P4 in the form of the band-limited RF pulses, and that the gradient field pulse applied in the same direction as that of the slice selection gradient field has the product of intensity and time So or 2So before and after the inversion pulse P1', P2', P3' or P4' so that the application period of the gradient field does not overlap that of the inversion pulse. Similarly, the replacement with the non-selective pulse may be effected in connection with the embodiments shown in FIGS. 6 and 7. With the non-selective inversion pulse used, the multi-slice measurement utilizing the aforementioned measurement wait time can not be applied but instead more ideal spin inversion can be realized.

In the foregoing description, the gradient coils 12, 13 and 14 of FIG. 4 are respectively dedicated to the generation of slice selection gradient field, the generation of readout gradient field and the generation of phase encoding gradient field. Incidentally, in order to image a slice oblique to directions of the gradient fields generated by these gradient field coils, three kinds of gradient fields orthogonal to each other may be generated on the basis of a resultant field generated by a plurality of gradient field coils as well known in the art. In other words, when the slice selection gradient field, readout gradient field and phase encoding gradient field used in the embodiments of FIGS. 5 to 7 and FIG. 9 have waveforms $S(t)$, $R(t)$ and $E(t)$, respectively, the gradient field coils may have waveforms $S'(t)$, $R'(t)$ and $E'(t)$, respectively, which are defined by the following matrix of rotation:

$$\begin{pmatrix} S'(t) \\ R'(t) \\ E'(t) \end{pmatrix} = R \begin{pmatrix} S(t) \\ R(t) \\ E(t) \end{pmatrix} \quad (6).$$

The individual value of the product of intensity and time of the gradient field pulse, shown in the each embodiment, are integer times the minimum one. But we can make the individual value of the product of intensity and time not integer times, for example 1.5, 2.7, the minimum one.

We claim:

1. A nuclear magnetic resonance multi-echo imaging method for eliminating an artifact signal and an error signal from an echo signal sampled for formation of an image so as to make the image correct, comprising the steps of:
   (a) exciting a nuclear spin in a specified slice of an object placed in a static magnetic field by applying a slice selection gradient field pulse and an RF exciting pulse in a first direction orthogonal to said slice;
   (b) applying a phase encoding gradient field in a second direction to assign the phase of said spin with positional information and generating an NMR echo signal a plurality of times by applying an effective inversion pulse a plurality of times;
   (c) sampling each NMR echo signal under the application of a readout gradient field in a third direction,
   said steps (a) to (c) forming a series of measurement sequence wherein gradient field pulses having predetermined products of intensity and time are added in at least two of said first, second and third directions to dephase components of a magnetization vector which cause said artifact signal and error signal;
   (d) executing said measurement sequence repetitively by changing the product of intensity and time of said phase encoding gradient field; and
   (e) subjecting data of each echo signal to multi-dimensional Fourier transform to form an image from a spin distribution indicated by each echo signal.

2. A nuclear magnetic resonance multi-echo imaging method according to claim 1 wherein the Fourier transform carried out in step (e) for image formation is two-dimensional and an image thus formed is also two-dimensional.

3. A nuclear magnetic resonance multi-echo imaging method according to claim 2 wherein the number of applications of said inversion pulse is four, and said gradient field pulses are applied in the following manner:

$S_1$, $S_3 = S_o$,
$S_2$, $S_4 = 2S_o$,
$R_1$, $R_4 = R_o$
$R_2$, $R_3 = 2R_o$
$E_1$, $E_2$, $E_3$, $E_4 = 0$ where $S_n$, $R_n$ and $E_n$ respectively represent the product of intensity and time of the slice selection gradient field pulses, that of the readout gradient field pulses and that of the gradient field pulses in the same direction as that of the phase encoding gradient field, said pulses being applied before and after the n-th inversion pulse, and $S_o$ and $R_o$ are sufficiently large values.

4. A nuclear magnetic resonance multi-echo imaging method according to claim 2 wherein the number of applications of said inversion pulse is six, and said gradient field pulses are applied in the following manner:

$S_1$, $S_6 = S_o$
$S_2$, $S_5 = 3S_o$
$S_3$, $S_4 = 2S_o$
$R_1$, $R_3$, $R_5 = R_o$
$R_2$, $R_4$, $R_6$, $= 2R_o$
$E_1 \sim E_6 = 0$ where $S_n$, $R_n$ and $E_n$ respectively represent the product of intensity and time of the slice selection gradient field pulses, that of the readout gradient field pulses and that of the gradient field pulses in the same direction as that of the phase encoding gradient field, said pulses being applied before and after the n-th inversion pulse, and $S_o$ and $R_o$ are sufficiently large values.

5. A nuclear magnetic resonance multi-echo imaging method according to claim 2 wherein the number of applications of said inversion pulse is eight and said gradient field pulses are applied in the following manner:

$S_1$, $S_3$, $S_5$, $S_7 = S_o$,
$S_2$, $S_4$, $S_6$, $S_8 = 2S_o$,
$R_1$, $R_4$, $R_5$, $R_8 = R_o$,
$R_2$, $R_3$, $R_6$, $R_7 = 2R_o$,
$E_1$, $E_3$, $E_6$, $E_8 = 0$,
$E_2$, $E_4$, $E_5$, $E_7 = E_o$ where $S_n$, $R_n$ and $E_n$ respectively represent the product of intensity and time of the slice selection gradient field pulses, that of the readout gradient field pulses and that of the gradient field pulses in the same direction as that of the phase encoding gradient field, said pulses being applied before and after the n-th inversion pulse, and $S_o$, $R_o$ and $E_o$ are sufficiently large values.

6. A nuclear magnetic resonance multi-echo imaging method according to claim 2 wherein the number of applications of said inversion pulse is five, and said gradient field pulses are applied in the following manner:

$S_1$, $S_3$, $S_5 = 2S_o$,
$S_2$, $S_4 = S_o$,
$R_1$, $R_3$, $R_5 = R_o$
$R_2$, $R_4 = 2R_o$
$E_1$, $E_2 = 0$
$E_3$, $E_4$, $E_5 = E_o$ where $S_n$, $R_n$ and $E_n$ respectively represent the product of intensity and time of the slice selection gradient field pulses, that of the readout gradient field pulses and that of the gradient field pulses in the same direction as that of the phase encoding gradient field, said pulses being applied before and after the n-th inversion pulse, and So, Ro and Eo are sufficiently large values.

7. A nuclear magnetic resonance multi-echo imaging method according to claim 2 wherein said inversion pulse is a band-limited selective pulse, and another series of measurement sequence is executed to measure multi-echoes for a spin in a different slice parallel to said specified slice during wait time intervening between repetitions of said series of measurement sequence, thereby performing measurement of a plurality of slices which are parallel to each other.

8. A nuclear magnetic resonance multi-echo imaging method according to claim 7 wherein said RF exciting pulse for each measurement sequence has a slice thickness in its frequency characteristic which is smaller than a slice thickness and a center to center distance between adjacent slices that said inversion pulse has in its frequency characteristic.

9. A nuclear magnetic resonance multi-echo imaging method according to claim 8 wherein said inversion pulse has in its frequency characteristic a slice selective characteristic which is substantially flat within the range of slice thickness of said RF exciting pulse.

10. A nuclear magnetic resonance multi-echo imaging method according to claim 2 wherein said inversion pulse is a wide band RF pulse, and said additional gradient field pulse is applied before and after said inversion pulse so as not to overlap said inversion pulse.

11. A nuclear magnetic resonance multi-echo imaging apparatus for eliminating an artifact signal and an error signal from an echo signal sampled for formation of an image so as to make the image correct, comprising:

(a) means for exciting a nuclear spin in a slice of an object placed in a static magnetic field by applying a slice selection gradient field pulse and an RF exciting pulse in a first direction orthogonal to said slice;

(b) means for applying a phase encoding gradient field in a second direction to assign the phase of said spin with positional information and generating an NMR echo signal a plurality of times by applying an effective inversion pulse a plurality of times;

(c) means for sampling each NMR echo signal under the application of a readout gradient field in a third direction, said means (a) to (c) forming a series of measurement means wherein gradient field pulses having predetermined products of intensity and time are added in at least two of said first, second and third directions to dephase components of a magnetization vector which cause said artifact signal and error signal;

(d) means for executing said measurement sequence repetitively by changing the product of intensity and time of said phase encoding gradient field; and (e) means for subjecting data of each echo signal to multi-dimensional Fourier transform to form an image from a spin distribution indicated by each echo signal.

* * * * *